(12) United States Patent
Ashrafzadeh

(10) Patent No.: US 9,735,768 B2
(45) Date of Patent: Aug. 15, 2017

(54) LOAD BALANCING IN DISCRETE DEVICES

(71) Applicant: Fairchild Semiconductor Corporation, San Jose, CA (US)

(72) Inventor: Ahmad R. Ashrafzadeh, Morgan Hill, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 445 days.

(21) Appl. No.: 14/337,627

(22) Filed: Jul. 22, 2014

(65) Prior Publication Data

US 2015/0035384 A1 Feb. 5, 2015

Related U.S. Application Data

(60) Provisional application No. 61/860,522, filed on Jul. 31, 2013.

(51) Int. Cl.

| | |
|---|---|
| H01H 35/14 | (2006.01) |
| H01H 37/00 | (2006.01) |
| H01H 47/24 | (2006.01) |
| H01H 47/26 | (2006.01) |
| H03K 17/082 | (2006.01) |
| H03K 17/12 | (2006.01) |
| H03K 17/08 | (2006.01) |

(52) U.S. Cl.
CPC ....... *H03K 17/0828* (2013.01); *H03K 17/127* (2013.01); *H01L 2224/48145* (2013.01); *H01L 2224/48247* (2013.01); *H01L 2224/48257* (2013.01); *H01L 2224/49111* (2013.01); *H01L 2924/13055* (2013.01); *H03K 2017/0806* (2013.01); *Y10T 307/773* (2015.04)

(58) Field of Classification Search
CPC .... H03K 17/78; H03K 17/941; H03K 17/145; H03K 17/94; H03K 17/00; H03K 17/133; H03K 17/14; H03K 17/22; H03K 17/223; H03K 17/56; H03K 17/687; H03K 2017/0806; H03K 21/10; H03K 3/012
See application file for complete search history.

(56) References Cited

U.S. PATENT DOCUMENTS

| | | | | |
|---|---|---|---|---|
| 5,949,121 A | * | 9/1999 | Qualich | H01L 27/0211 257/467 |
| 8,786,361 B1 | * | 7/2014 | Hess | G01D 3/028 327/434 |

(Continued)

*Primary Examiner* — Jared Fureman
*Assistant Examiner* — Esayas Yeshaw
(74) *Attorney, Agent, or Firm* — Brake Hughes Bellermann LLP

(57) ABSTRACT

In a general aspect, an apparatus can include a temperature measurement circuit configured to produce a first signal indicating a first operating temperature of a first semiconductor device and a temperature comparison circuit operationally coupled with the temperature measurement circuit. The temperature comparison circuit can be configured to compare the first signal with a second signal indicating a second operating temperature of at least a second semiconductor device and produce a comparison signal indicating whether the indicated first operating temperature is higher, lower or equal to the indicated second operating temperature. The apparatus can also include an adjustment circuit configured to adjust operation of the first semiconductor device based on the comparison signal.

18 Claims, 2 Drawing Sheets

(56) References Cited

U.S. PATENT DOCUMENTS

| | | | | |
|---|---|---|---|---|
| 8,872,489 B2* | 10/2014 | Ryu | ............... | H02M 3/07 |
| | | | | 323/266 |
| 2004/0090726 A1* | 5/2004 | Ball | ............... | H02H 9/001 |
| | | | | 361/93.9 |
| 2006/0290209 A1* | 12/2006 | Bouchard | ......... | H05B 41/2926 |
| | | | | 307/137 |
| 2008/0267256 A1* | 10/2008 | Watanabe | ............ | G01K 7/425 |
| | | | | 374/141 |
| 2009/0129438 A1* | 5/2009 | Pan | ............... | G01K 7/01 |
| | | | | 374/170 |
| 2011/0156799 A1* | 6/2011 | Zanardi | ............. | G01K 3/005 |
| | | | | 327/512 |
| 2011/0239914 A1* | 10/2011 | Yamada | ............. | F23N 5/022 |
| | | | | 110/185 |

* cited by examiner

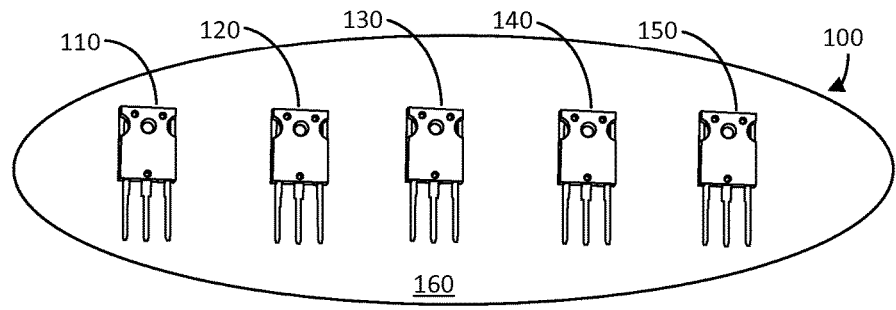
FIG. 1
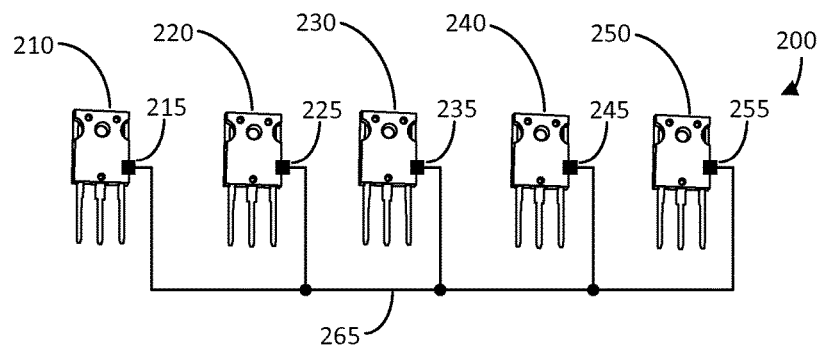
FIG. 2
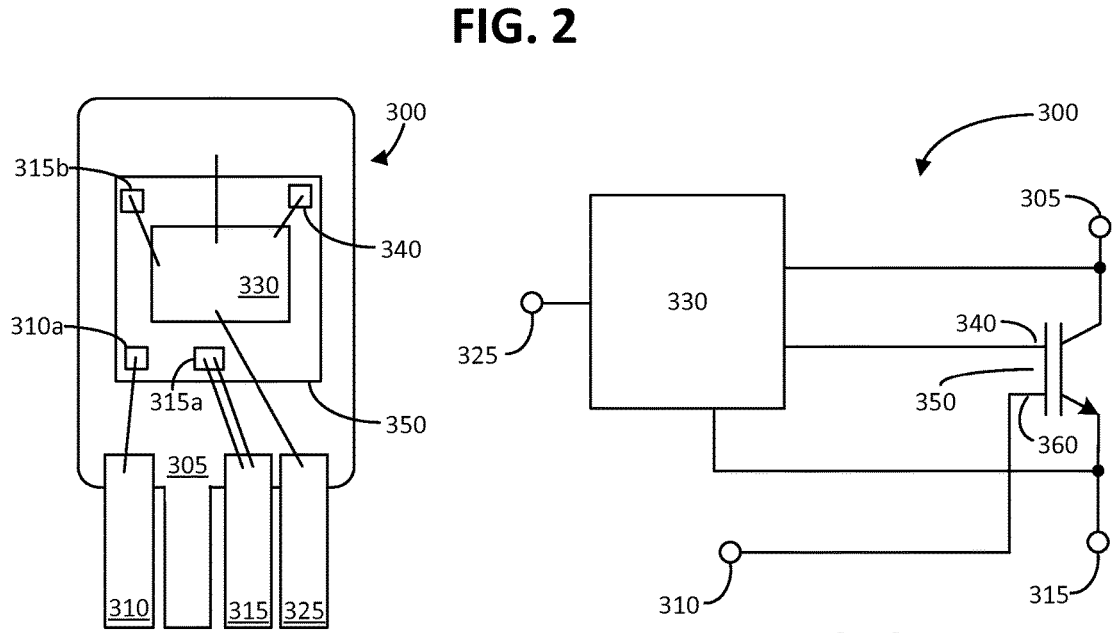
FIG. 3A
FIG. 3B

LOAD BALANCING IN DISCRETE DEVICES

CROSS REFERENCE TO RELATED APPLICATIONS

This application claims priority to and the benefit of U.S. Provisional Application No. 61/860,522, entitled, "Load Balancing in Discrete Devices," filed Jul. 31, 2013, which is incorporated herein by reference in its entirety.

TECHNICAL FIELD

This description relates to discrete devices. In particular, the description relates to techniques for balancing current (power) dissipation in discrete semiconductor devices based on operating temperature.

BACKGROUND

In power electronics applications, such as industrial and automotive applications, it is common to connect power semiconductor switches (e.g., vertical field-effect-transistors, insulated-gate bipolar transistors, etc.) in a parallel arrangement in order to achieve higher current switching capabilities than may be achieved by a single power semiconductor switch. In such approaches, current (or power dissipation) is distributed across the parallel connected switch devices. Such parallel connected devices may be implemented, monolithically, on a single semiconductor chip (die). However, such monolithic implementations may result in semiconductor devices that have relatively large chip (die) sizes and, therefore, may be difficult to manufacture. Further, monolithic implementations may have relatively low manufacturing yield (e.g., as a result of the large die size) and, accordingly, may increase cost per semiconductor switch.

Additionally, monolithic implementations have a single thermal dissipation point for all of the parallel connected switches in a given device, which may cause difficulties in removing thermal energy from the monolithic device. Such difficulty in removing thermal energy may cause higher than desired operating temperatures, which may decrease the lifetime (reliability) of such devices.

One approach that may overcome some of the limitations of monolithic implementations is to connect single discrete devices (implemented on separate die) in parallel, where the single discrete devices may be housed in separate packages and, e.g., may be electrically connected in parallel (and physically mounted) on a printed circuit board. While overcoming some of the drawbacks of monolithic implementations (e.g., large die size, single thermal dissipation point, etc.), approaches that use parallel connected discrete (single) power switch devices also have drawbacks.

For instance, parallel connected discrete devices do not inherently share current/power dissipation equally between them, due, for example, to differences in their operating parameters and/or thermal interaction between the discrete switch devices (and other components that may implemented in conjunction with the discrete switch devices). To improve the balance of current/power dissipation between such parallel implemented discrete switch devices, a selection process may be used to match devices based on their operating parameters, such as threshold voltage ($V_t$) and saturation voltage ($V_{sat}$). This process may, however, be costly and difficult to implement.

BRIEF DESCRIPTION OF THE DRAWINGS

FIG. 1 is a diagram illustrating thermal interaction between individual devices of a group of discrete semiconductor devices in accordance with an embodiment.

FIG. 2 is schematic diagram that illustrates a group of discrete semiconductor devices coupled with a bus for sharing temperature information that is used to balance current (power) dissipation in accordance with an embodiment.

FIG. 3A is a diagram illustrating a plan view of a discrete device in accordance with an embodiment.

FIG. 3B is a schematic/block diagram illustrating the discrete device of FIG. 3A in accordance with an embodiment

Like reference symbols in the various drawings indicate like and/or similar elements.

DETAILED DESCRIPTION

Figure 4:
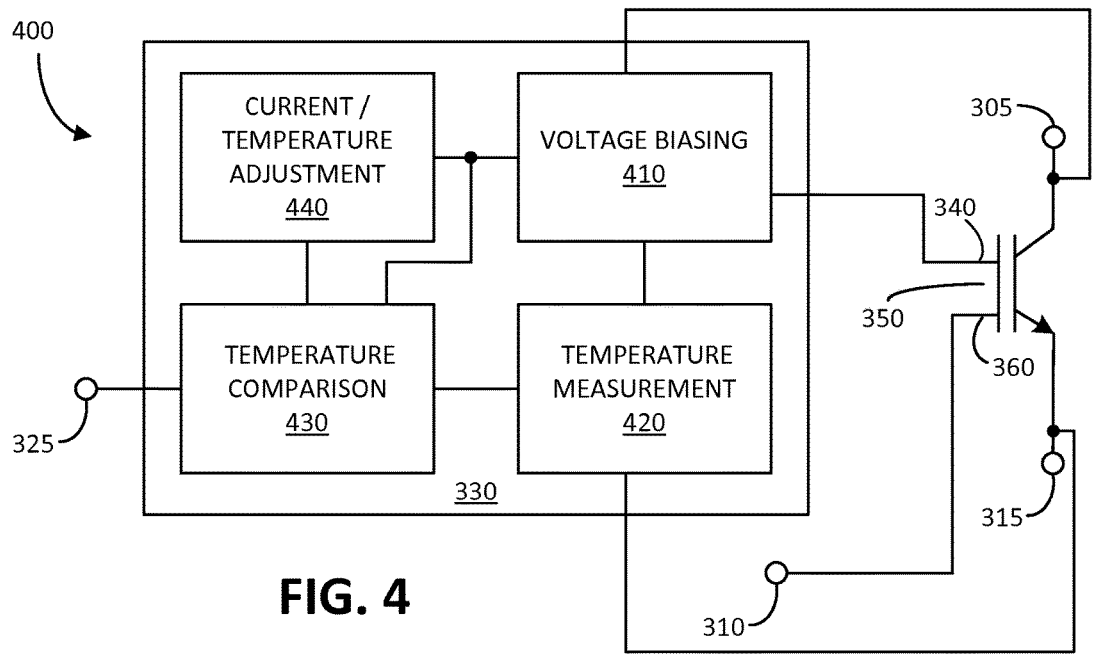
FIG. 4 is a schematic/block diagram illustrating a discrete device in accordance with an embodiment.

FIG. 1 is a diagram that illustrates a physical arrangement of, and associated thermal interaction between, a plurality of discrete semiconductor devices 110, 120, 130, 140, 150 (e.g., power semiconductor switch devices) in a circuit 100 according to an embodiment. The semiconductor devices 110-150 of FIG. 1 may be electrically connected as parallel switches in order to achieve a desired switching current. However, for the purposes of clarity and illustration, the parallel electrical connections for the semiconductor devices 110-150 are not shown in FIG. 1.

As is illustrated in FIG. 1, the semiconductor devices 110-150 are three terminal switch devices. For instance, in certain embodiments the semiconductor devices 110-150 may be implemented using power metal-oxide semiconductor field effect transistors MOSFET (MOSFETs), insulated-gate bipolar transistors (IGBTs), thyristors (including gate turn-off thyristors), bipolar junction transistors, or may be implemented using a number of other types of discrete power semiconductor switch devices. In the case of power MOSFETs, the three terminals of the semiconductor devices 110-150 may be a gate terminal, a source terminal and a drain terminal. For implementations using IGBTs, the three terminals of the semiconductor devices 110-150 may be a gate terminal (which can also be referred to as a control terminal), an emitter terminal and a collector terminal. In other embodiments, other arrangements with other types of devices (and numbers of terminals) are possible.

In FIG. 1, thermal interaction between the semiconductor devices 110-150 (e.g., when those devices are operating) is diagrammatically illustrated by the oval 160. As shown in FIG. 1, each of the semiconductor devices that are located in the middle of the (thermal interaction) oval 160 (e.g., devices 120, 130, 140) may be more affected by (subject to more of) the thermal energy that is generated by the other devices in the group than the semiconductor devices at the ends of the arrangement (e.g., devices 110, 150). Accordingly, the semiconductor devices in the middle of the (thermal interaction) oval 160 (e.g., devices 120, 130, 140) may, as a result of this thermal interaction, operate at a higher temperature (or higher temperatures) than the devices 110, 150, which is undesirable, as such temperature differences may affect performance and/or reliability of the circuit 200.

Using the approaches described herein, a group of parallel connected semiconductor switch devices, such as the semiconductor devices 110-150, may share information (via a bus), where the information shared by each device indicates its respective operating temperature. That shared temperature information may then be used (by each device) to balance current/power dissipation across the group of parallel connected devices, so as to improve performance and/or reliability.

FIG. 2 is a schematic diagram illustrating a circuit 200 that includes a group of semiconductor devices 210, 220, 230, 240, 250 according to an embodiment. As discussed with respect to the semiconductor devices 110-150 in FIG. 1, the semiconductor devices 210-250 may include parallel connected discrete semiconductor power switch devices, such as vertical power MOSFETs, IGBTs, or a number of other semiconductor power switch devices. Again, for purposes of clarity and illustration, the electrical connections for the switch devices in FIG. 2 are not shown.

As illustrated in FIG. 2, each of the semiconductor devices 210-250 includes a fourth terminal, respectively, temperature share terminals (share terminals) 215, 225, 235, 245, 255. In the circuit 200, each of the share terminals 215-255 may be configured to provide information corresponding with an operating temperature of its respective semiconductor device 210-250. For example, each of the semiconductor devices 210-250 may output a voltage (on its respective share terminal 215-255) that is representative of its operating temperature.

As shown in FIG. 2, the share terminals 215-255 may be coupled together via a temperature share bus (share bus) 265. In this example, a voltage on the share bus 265 may represent an average operating temperature for the group of semiconductor devices 210-250. As discussed in further detail below, each of the semiconductor devices 210-250 may compare its respective operating temperature with the average operating temperature (e.g., by comparing the voltage representing its operating temperature with the voltage on the share bus 265). In such an approach, each of the semiconductor devices 210-250 may then adjust its current/power dissipation based on this comparison, such as using the techniques described herein.

For instance, in an example implementation, if a given semiconductor device of the semiconductor devices 210-250 is operating at a temperature that is higher than the average operating temperature (e.g., based on a voltage on the share bus 265), the given semiconductor device may reduce an amount of current/power it is dissipating, such as by reducing the transconductance of a power semiconductor switch included in the given semiconductor device (such as using the approaches discussed herein). Conversely, if the given semiconductor device is operating at a temperature that is below the average operating temperature, the given semiconductor device may increase the amount of current/power it is dissipating, such as by increasing the transconductance of the power semiconductor switch included in the given semiconductor device. Example embodiments for implementing such approaches are illustrated in FIGS. 3A-5, and described in further detail below.

FIG. 3A is a diagram illustrating a plan view of a discrete device 300 in accordance with an embodiment (e.g., prior to packaging the discrete device). In an example embodiment, the discrete device 300 may be used to implement the semiconductor devices 210-250 in FIG. 2. As shown in FIG. 3A, the discrete device 300 is implemented as a four terminal device (such as illustrated for the semiconductor devices 210-250 of FIG. 2).

For instance, the discrete device 300 of FIG. 3A includes a first terminal 305, a second terminal 310, a third terminal 315 and a fourth terminal 325. In this particular example, the terminals 305, 310, 315 may correspond with the three terminals of a semiconductor switch device 350, such as a MOSFET, an IGBT, or a number of other semiconductor switch devices. For purposes of clarity and illustration, the embodiments illustrated in FIGS. 3A-5 are described as including an IGBT for the semiconductor switch device 350. Accordingly, in the following discussion, the semiconductor switch device 350 may also be referred to as IGBT 350. However, in other implementations, other discrete devices may be used instead of an IGBT, such as a vertical power MOSFET, as one example.

As illustrated in FIG. 3A, the terminal 305 may be part of a power supply plane for the IGBT 350. This power supply plane may be electrically coupled with a collector terminal of the IGBT 350. For instance, the IGBT 350 may be a vertically conducting discrete IGBT that is implemented on a semiconductor die with a backside collector contact. The backside collector contact may be electrically coupled with the terminal (power supply plane) 305, such as is illustrated in FIG. 3A. For instance, the IGBT 350 may be electrically coupled with the power supply plane using a conductive die attach material.

As also shown in FIG. 3A, the terminal 310 may be electrically connected (via a bond wire) to a bond pad 310a (and electrically isolated from the terminal 305). The terminal 310 may be used to communicate a signal for biasing a gate of the IGBT 350, e.g., to turn the IGBT 350 on and off. As further illustrated in FIG. 3A, the terminal 315 may be electrically connected (using one or more bond wires) with an emitter contact, via a bond bad 315a, on the top side of the semiconductor die of the IGBT 350. The terminal 305 may also be electrically isolated from the terminal 305. In some embodiments, the connection between the terminal 315 and the emitter may be made in a number of other ways.

The discrete device 300 in FIG. 3A also includes a share controller 330 that may be configured to measure an operating temperature of the IGBT 350 and provide a voltage, via the share terminal 325, which corresponds with the operating temperature of the IGBT 350. The share controller 330 may also be configured to compare the measured operating temperature of the IGBT 350 with an average temperature of a group of parallel connected discrete semiconductor devices. This average temperature may be determined from a voltage that is present on a share bus, such as the share bus 265 of FIG. 2. As shown in FIG. 3A, the share controller 330 may be implemented on a semiconductor die that is physically coupled with the IGBT 350. This arrangement allows for the share controller to measure an operating temperature of the IGBT 350. In such approaches, the share controller 330 may be physically coupled with the IGBT 350 using a number of semiconductor die stacking techniques.

The share controller 330 may be further configured to adjust a transconductance of the IGBT 350 based on such a comparison. As shown in FIG. 3A, the share controller 330 may be electrically connected (via a bond wire) with a bond pad that is electrically connected with a secondary gate 340 of the IGBT 350 (discussed further below). In such an approach, the share controller 330 may be configured to provide a voltage signal to the secondary gate 340 in order to increase and/or decrease the transconductance of the IGBT 350. Such changes in transconductance may be made in response to the comparison of the operating temperature of the IGBT 350 with an average operating temperature of a group of parallel connected devices that includes the discrete device 300. Such a temperature comparison can be made by comparing respective voltages representing the different temperatures. In other implementations, the share controller 330 can be integrated on the same die with the IGBT 350 (or other discrete switch device), or co-packaged with IGBT 350 in the same package.

As is also illustrated in FIG. 3A, the share controller 330 is electrically connected (via respective bond wires and bond pads) to both the (collector) terminal 305 and the emitter of the IGBT 350 (via a bond pad 315b). In such an arrangement, the voltage biases on the emitter and collector of the IGBT 350 may be used to provide power to the share controller 330. Such approaches may allow for the share controller 330 to operate without the need for separate power supply connections that would require additional terminals on the discrete device 300 for providing those separate power supply connections to the share controller 330.

FIG. 3B is a schematic/block diagram illustrating an implementation of the discrete device 300 of FIG. 3A in accordance with an embodiment. In FIG. 3B, the elements of the discrete device 300 are referenced with the same reference numbers as in FIG. 3A.

As shown in FIG. 3B, the share controller 330 is coupled with the (collector) terminal 305, the (emitter) terminal 315 and the secondary gate 340 of the IGBT 350. As noted above, the secondary gate 340 may be used to vary the transconductance of the IGBT 350. In the approaches described herein, such transconductance adjustments can be done iteratively (e.g., as individual operating temperatures of a group of parallel connected devices vary).

As also discussed above with respect to FIG. 3A, the share controller 330 in FIG. 3B may be biased (powered) using voltage biases that are applied to the (collector) terminal 305 and the (emitter) terminal 315. In certain embodiments, the voltage applied to the (collector) terminal 305 may be 300 V or higher and the voltage applied to the (emitter) terminal 315 (and the emitter 320) may be electrical ground. In such embodiments, as is discussed further below, the share controller 330 may be configured to translate the collector voltage to a lower voltage (or range of voltages) that is used to both power circuit elements of the share controller 330 and to adjust the transconductance of the IGBT 350 based on its operating temperature, such as using the techniques described herein.

In such approaches, the share controller 330 may be configured to translate the collector voltage to a range of voltages (e.g. 5-10V) that is appropriate for both powering the circuit elements of the share controller 330 and for adjusting the transconductance of the IGBT 350. Further in such approaches, a capacitance of the secondary gate 340 of the IGBT 350 may be used to maintain an adequate voltage bias (e.g., Vdd) for operating the share controller 330 when the IGBT 350 is turned on (and the collector voltage is at approximately 1 V). In still other approaches, supply voltages for the share controller 330 may be generated in other fashions. For instance supply voltages for the share controller could be generated from a voltage that is applied to the primary gate terminal 310 of the IGBT 350. As another alternative, a separate voltage biasing circuit may be used to provide supply voltages for the share controller 330, where the voltage biasing circuit 410 is only used to adjust the transconductance of the IGBT 350 (e.g., by varying a voltage applied on the secondary gate 340).

As is further shown in FIG. 3B, the terminal 310 is coupled with a primary gate 360 of the IGBT 350. As described above, the primary gate 360 may be used to turn the IGBT 350 on and off. In the discrete device 300 of FIG. 3B, the share controller 330 is coupled with the share terminal 325 of the discrete device 300. In such an approach, the share controller 330 may be configured to generate a voltage corresponding with an operating temperature of the IGBT 350, apply the determined voltage (e.g., via a resistor) to the share terminal 325, compare the generated voltage with a voltage on a share bus that corresponds with an average temperature of a group of parallel connected discrete devices (including the discrete device 300) and dynamically adjust the transconductance of the IGBT 350 based on that comparison. Example embodiments that may be used to implement the discrete device 300 are described below with respect to FIG. 4 and FIG. 5.

FIG. 4 is a schematic/block diagram illustrating a discrete device 400 in accordance with an embodiment. In certain embodiments, the discrete device 400 may be used to implement the discrete devices 210-250 of FIG. 2 and/or the discrete device 300 of FIGS. 3A and 3B. In other implementations, other arrangements for a discrete device may be used. In FIG. 4, like elements of the discrete device 400 are referenced with the same reference numbers as in FIGS. 3A and 3B. For instance, the discrete device 400 includes the emitter terminal 305, the primary gate terminal 310, the collector terminal 315, the share terminal 325 and the IGBT 350 (including the secondary gate 340 and the primary gate 360). For purposes of clarity and brevity, these elements are not described again in detail with respect to FIG. 4.

The discrete device 400 shown in FIG. 4 also includes an example embodiment of the share controller 330. The example share controller 330 shown in FIG. 4 includes a voltage biasing circuit 410, a temperature measurement circuit 420, a temperature comparison circuit 430 and a current/temperature adjustment circuit 440. In the discrete device 400, the voltage biasing circuit 410 is coupled with the collector terminal 305. The voltage biasing circuit 410 may be configured to, based on a control signal from the current/temperature adjustment circuit 440, translate a voltage applied on the collector terminal 305 (e.g., a voltage of 300 V or more) to a range of voltages that is appropriate for powering the temperature measurement circuit 420, powering the temperature comparison circuit 430 and powering the current temperature adjustment circuit 440 (e.g., providing a power supply voltage, Vdd, to the share controller 330). The range of voltages generated by the voltage biasing circuit 410 may also be appropriate for adjusting (increasing and decreasing) the transconductance of the IGBT 350 in response to temperature comparisons (e.g., comparisons of voltages representing temperatures), such as using the approaches described herein.

In the discrete device 400, the temperature measurement circuit 420 may be configured to determine an operating temperature of the IGBT 350 (e.g., where the share controller 330 is physically attached to (thermally coupled with) a semiconductor die including the IGBT 350). The temperature measurement circuit 420 may also be configured to generate a voltage corresponding with the determined operating temperature. The temperature measurement circuit 420 may be further configured to provide the generated voltage corresponding with the determined operating temperature to the temperature comparison circuit 430.

In this embodiment, the temperature comparison circuit 430 may be configured to apply (e.g., via a resistor) the voltage generated by the temperature measurement circuit 420 to a share bus, such as the share bus 265, and to compare the voltage generated by the temperature measurement circuit 420 to an aggregate voltage on the share bus. As previously discussed with respect to FIG. 3, the aggregate voltage represents an average temperature of a group of parallel connected discrete devices that include the discrete device 400 (e.g., an average of individual voltages applied by each of the parallel connected discrete devices representing their respective operating temperatures). The temperature comparison circuit 430 may be further configured to provide a signal to the current/temperature adjustment circuit 440 indicating whether the determined operating temperature for the IGBT 350 is higher or lower than the average operating temperature indicated by the aggregate voltage on the share bus.

In the discrete device 400, the current/temperature adjustment circuit 440 may be configured, based on the signal received from the temperature comparison circuit 430, to adjust the voltage biasing circuit 410 so as to increase or decrease the voltage applied to the secondary gate 340 of the IGBT 350 (to change the transconductance of the IGBT 350). For instance, if the operating temperature of the IGBT 350 determined by the temperature measurement circuit 420 is higher than an aggregate temperature of a group of parallel discrete connected devices indicated by a voltage on a share bus, the current/temperature adjustment circuit 440 may adjust the voltage biasing circuit 410 so as to decrease the transconductance of the IGBT 350 (e.g., reduce the voltage applied to the secondary gate 340).

Conversely, if the operating temperature determined by the temperature measurement circuit 420 is lower than the aggregate temperature of the group of parallel connected discrete devices indicated by the voltage on the share bus, the current/temperature adjustment circuit 440 may adjust the voltage biasing circuit 410 so as to increase the transconductance of the IGBT 350 (e.g., increase the voltage applied to the secondary gate 340). Further, if the operating temperature determined by the temperature measurement circuit is substantially equal to the aggregate temperature of the group of parallel connected discrete devices indicated by the voltage on the share bus, the current/temperature adjustment circuit 440 may maintain a voltage that is currently being generated by the voltage biasing circuit 410.

As an alternative to the implementations illustrated in FIGS. 2-4, rather than each discrete device in a group of parallel connected discrete devices including a temperature comparison circuit 430 and a current/temperature adjustment circuit 440, a central controller can be used. In such an approach, each discrete device could provide operating temperature information to the central controller and the central controller could make temperature comparisons and then make adjustments (e.g., transconductance/voltage bias adjustments) to each of the discrete devices based on those comparisons. In such approaches, the central controller could be implemented using hardware, firmware, a microcontroller, software, or any appropriate combination of these or other approaches.

Figure 5:
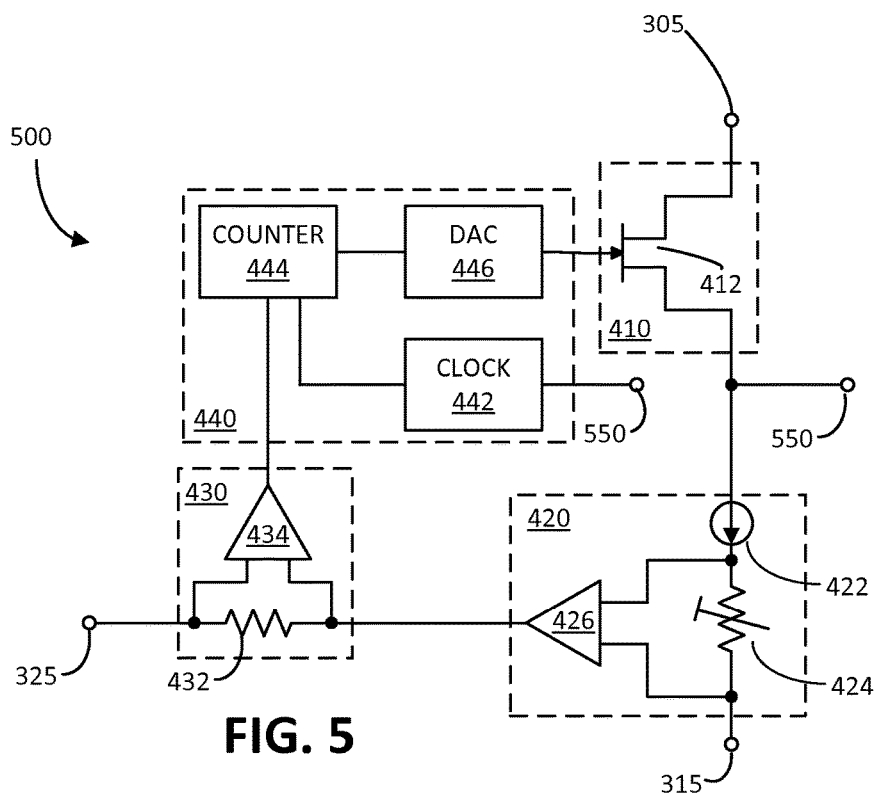
FIG. 5 is a schematic/block diagram illustrating a controller for current/power balancing that may implemented in a discrete device in accordance with an embodiment.

FIG. 5 is a schematic/block diagram illustrating a share controller 500 that may implemented in the discrete devices of FIGS. 2, 3A, 3B and 4 in accordance with an embodiment. In FIG. 5, as compared with FIGS. 3, 3B and 4, the IGBT 350 is not shown. However, common elements of share controller 500 with those of FIGS. 3A, 3B and 4 are referenced with like reference numerals. For instance, the share controller 500 includes the (collector) terminal 305, the (emitter) terminal 315 and the share terminal 325. The share controller 500 also includes a terminal 540 that may be coupled with a secondary gate of a discrete switch device, such as the secondary gate 340 of the IGBT 350 shown in FIGS. 3A, 3B and 4.

The share controller 500 illustrated in FIG. 5 also includes example implementations of the voltage biasing circuit 410, the temperature measurement circuit 420, the temperature comparison circuit 430 and the current/temperature adjustment circuit 440 shown in FIG. 4. In this implementation, the voltage biasing circuit 410 includes a junction field-effect transistor (JFET) 412. The JFET 412, based on a signal from the current/temperature adjustment circuit 440, may translate a collector voltage applied on the terminal 305 to a range of voltages that is used to power the share controller 500 (provide Vdd), as well as adjust the transconductance of a semiconductor switch device (e.g., via a secondary gate) coupled with the terminal 540. For clarity, the power supply connections for the elements of the controller 500, which were shown in FIG. 4, are not illustrated in FIG. 5. In other implementations, a number of other voltage biasing circuits may be used, and power may be provided to the elements of the share controller 500 using a number of other approaches.

In the share controller 500, the temperature measurement circuit 420 may include a current source 422 and a temperature sensing device 424. Depending on the specific embodiment, the temperature measurement circuit 420 may be implemented by a proportional to absolute temperature (PTAT) sensor, a thermistor, or a number of other devices capable of generating a voltage based on an ambient temperature of the temperature sensing device 424. The temperature measurement circuit 420 of FIG. 5 also includes an amplifier 426 that is configured to generate a voltage representing an operating temperature of an associated discrete semiconductor switch device, as detected by the temperature sensing device 424 (e.g., based on a voltage across the temperature sensing device 424).

The voltage generated by the temperature measurement circuit 420 is applied to the temperature comparison circuit 430 and to the share terminal 325 (and a share bus) via a resistor 432 included in the temperature comparison circuit 430. The temperature comparison circuit 430 also includes a comparator 434 that compares the voltage from the temperature measurement circuit 420 with an aggregate voltage on the share terminal 325 (where the aggregate voltage represents an average operating temperature of a group of parallel connected discrete devices). Based on this comparison, the comparator 434 provides a signal to the current/temperature adjustment circuit 440 that indicates whether the temperature measured by the temperature measurement circuit 420 is greater than, equal to or less than an average temperature represented by the voltage (from a share bus) on the share terminal 325.

As shown in FIG. 5, the current/temperature adjustment circuit 440 includes a clock 442, a counter 444 and a digital-to-analog converter (DAC) 446. In the share controller 500, the clock 442 that can be used as a reference for the counter 444. As shown in FIG. 5, the clock 442 may be coupled with an input terminal 550. In such an approach, the clock 442 may be driven by a clock input signal on the input terminal 550. For instance, a signal on a primary gate of a discrete semiconductor switch device that is implemented in conjunction with the share controller 500 may be used to provide a clock signal to the counter 444. In other embodiments, a number of other approaches for providing a clock signal on the input terminal 550 may be used. In other embodiments, the clock 442 may be a free running clock (that does not use an input signal). In other embodiments a clock signal may be provided to the counter 444 in other ways.

In the share controller 500, the DAC 446 may be configured to convert a digital count value of the counter 444 to an analog voltage that is applied to the voltage biasing circuit 410 (e.g., the gate of the JFET 412). In other implementations, the current/temperature adjustment circuit 440 may be implemented using, for example, an analog integrator as an alternative to the approach illustrated in FIG. 5.

Based on the signal provided to the current/temperature adjustment circuit 440 by the temperature comparison circuit 430, the counter 444 may count up, may count down, or may maintain an existing count. For instance, if the temperature comparison circuit 430 determines that an operating temperature measured by the temperature measurement circuit 420 is greater than an average temperature (of a group of parallel connected device) indicated on the share terminal 325 (e.g., current is flowing out of the share controller 500), the temperature comparison circuit 430 may direct the counter 444 to count down. As the count in the counter 444 decreases, the voltage applied to the gate of the JFET 412 by the DAC 446 may also decrease. This will result in a corresponding decrease in the voltage applied to the (secondary gate) terminal 540, thus decreasing the transconductance of an associated semiconductor switch device and should reduce the operating temperature of the switch device.

If the temperature comparison circuit 430 determines that an operating temperature measured by the temperature measurement circuit 420 is less than the average temperature indicated on the share terminal 325 (e.g., current is flowing into the share controller 500), the temperature comparison circuit 430 may direct the counter 444 to count up. As the count in the counter 444 increases, the voltage applied to the gate of the JFET 412 by the DAC 446 may also increase. This will result in a corresponding increase in the voltage applied to the (secondary gate) terminal 540, thus increasing the transconductance of an associated semiconductor switch device, which should balance the temperature of the associate semiconductor switch device more closely with the other discrete devices in the associated group of parallel connected discrete devices.

If the temperature comparison circuit 430 determines that an operating temperature measured by the temperature measurement circuit 420 is substantially equal to the average temperature indicated on the share terminal 325 (e.g., negligible, or no current is flowing into or out of the share controller 500), the temperature comparison circuit 430 may direct the counter 444 to maintain its current count. Accordingly, in this situation, the voltage applied to the gate of the JFET 412 by the DAC 446 will remain substantially constant.

In certain embodiments, when the operating temperature of a semiconductor switch that is determined by the temperature measurement circuit 420 is substantially equal to the average temperature of an associated group of parallel connected discrete devices, the count of the counter 444 may dither around a given value (corresponding with the average and/or measure temperature). For instance, the count may, over a given time where these temperatures are substantially equal, have a constant average value.

The various apparatus and techniques described herein may be implemented using various semiconductor processing, system manufacturing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
   a first semiconductor switch device;
   a temperature measurement circuit thermally coupled with the first semiconductor switch device, the temperature measurement circuit configured to produce a first signal indicating an operating temperature of the first semiconductor switch device;
   a temperature comparison circuit operationally coupled with the temperature measurement circuit, the temperature comparison circuit configured to:
     compare the first signal with a second signal indicating an operating temperature of at least a second semiconductor switch device; and
     produce a comparison signal indicating whether the indicated operating temperature of the first semiconductor switch device is higher, lower or equal to the indicated operating temperature of the at least the second semiconductor switch device; and
   an adjustment circuit operationally coupled with the temperature comparison circuit and the first semiconductor switch device, the adjustment circuit being configured to adjust a transconductance of the first semiconductor switch device in response to the comparison signal.

2. The apparatus of claim 1, wherein the adjustment circuit is configured to receive the comparison signal and produce an adjustment signal that adjusts the transconductance of the first semiconductor switch device based on the comparison signal.

3. The apparatus of claim 2, wherein:
if the comparison signal indicates that the indicated operating temperature of the first semiconductor switch device is higher than the indicated operating temperature of the at least the second semiconductor switch device, the adjustment circuit is configured vary the adjustment signal so as to reduce the transconductance of the first semiconductor switch device; and
if the comparison signal indicates that the indicated operating temperature of the first semiconductor switch device is lower than the indicated operating temperature of the at least the second semiconductor switch device, the adjustment circuit is configured to vary the adjustment signal so as to increase the transconductance of the first semiconductor switch device.

4. The apparatus of claim 3, wherein the comparison circuit is configured to change the transconductance of the first semiconductor switch device by varying a voltage of the adjustment signal, the adjustment signal being applied to a secondary control terminal of the first semiconductor switch device.

5. The apparatus of claim 2, wherein if the comparison signal indicates that the indicated operating temperature of the first semiconductor switch device is substantially equal to the indicated operating temperature of the at least the second semiconductor switch device, the adjustment circuit is configured to maintain the adjustment signal at a substantially constant voltage.

6. The apparatus of claim 2, wherein if the comparison signal indicates that the indicated operating temperature of the first semiconductor switch device is substantially equal to the indicated operating temperature of the at least the second semiconductor switch device, the adjustment circuit is configured to dither the adjustment signal around a substantially constant voltage.

7. The apparatus of claim 2, further comprising a voltage biasing circuit configured to receive the adjustment signal and vary a voltage applied to a secondary control terminal of the first semiconductor switch device in response to the adjustment signal.

8. The apparatus of claim 2, further comprising a voltage biasing circuit configured to receive a voltage that is applied to one of a collector terminal, a primary control terminal, a source terminal or a drain terminal of the first semiconductor switch device and, based on the received voltage, provide a supply voltage for the temperature measurement circuit, the temperature comparison circuit and the adjustment circuit.

9. The apparatus of claim 1, wherein the second semiconductor switch device is included in a plurality of semiconductor switch devices, the operating temperature indicated by the second signal indicating an average operating temperature of the plurality semiconductor switch devices.

10. The apparatus of claim 9, wherein the first semiconductor switch device and the plurality of semiconductor switch devices are electrically arranged in parallel.

11. An apparatus comprising:
a temperature share bus;
a plurality of semiconductor devices, each of the plurality of semiconductor devices including:
a semiconductor switch having a primary control terminal and a secondary control terminal; and
a share controller having a share terminal coupled with the temperature share bus, the share controller being thermally coupled with the semiconductor switch and configured to:
generate a voltage indicating an operating temperature of the semiconductor switch;
compare the voltage corresponding with the operating temperature of the semiconductor switch with a voltage on the temperature share bus, the voltage on the temperature share bus indicating an operating temperature of one or more other semiconductor switches of the plurality of semiconductor devices; and
adjust a transconductance of the semiconductor switch based on the comparison.

12. The apparatus of claim 11, wherein a power supply voltage of the share controller is based on a voltage signal applied to the primary control terminal.

13. The apparatus of claim 11, wherein a power supply voltage of the share controller is based on a voltage signal applied to one of a collector terminal of the semiconductor switch, a source terminal of the semiconductor switch or a drain terminal of the semiconductor switch.

14. The apparatus of claim 11, wherein the voltage on the temperature share bus corresponds with an average operating temperature of the plurality of semiconductor switches.

15. The apparatus of claim 11, wherein the plurality of semiconductor switches are electrically arranged in a parallel configuration.

16. A share controller comprising:
a temperature measurement circuit configured to produce a first signal indicating a first operating temperature of a first semiconductor device;
a temperature comparison circuit operationally coupled with the temperature measurement circuit, the temperature comparison circuit configured to:
compare the first signal with a second signal indicating a second operating temperature of at least a second semiconductor device; and
produce a comparison signal indicating whether the indicated first operating temperature is higher, lower or equal to the indicated second operating temperature; and
an adjustment circuit configured to adjust operation of the first semiconductor device based on the comparison signal.

17. The share controller of claim 16, wherein adjusting operation of the first semiconductor device includes one of increasing transconductance or decreasing transconductance.

18. The share controller of claim 16, wherein the second operating temperature corresponds with an average operating temperature of a plurality of semiconductor devices, the plurality of semiconductor devices including the first semiconductor device and the second semiconductor device.

* * * * *